US009236368B2

(12) United States Patent
Kumar et al.

(10) Patent No.: US 9,236,368 B2
(45) Date of Patent: Jan. 12, 2016

(54) SEMICONDUCTOR DEVICE INCLUDING EMBEDDED CONTROLLER DIE AND METHOD OF MAKING SAME

(71) Applicant: SANDISK INFORMATION TECHNOLOGY (SHANGHAI) CO., LTD., Shanghai (CN)

(72) Inventors: Shiv Kumar, Saharanpur (IN); Chin-Tien Chiu, Taichung (TW); Kaiyou Qian, Shanghai (CN); Cheeman Yu, Fremont, CA (US)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 14/422,155

(22) PCT Filed: Jan. 28, 2013

(86) PCT No.: PCT/CN2013/071051
§ 371 (c)(1),
(2) Date: Feb. 17, 2015

(87) PCT Pub. No.: WO2014/114003
PCT Pub. Date: Jul. 31, 2014

(65) Prior Publication Data
US 2015/0214206 A1 Jul. 30, 2015

(51) Int. Cl.
*H01L 23/52* (2006.01)
*H01L 25/18* (2006.01)
(Continued)

(52) U.S. Cl.
CPC .............. *H01L 25/18* (2013.01); *H01L 21/56* (2013.01); *H01L 23/13* (2013.01);
(Continued)

(58) Field of Classification Search
CPC ...... H01L 25/0657; H01L 25/16; H01L 25/18; H01L 23/4824; H01L 24/24; H01L 24/82; H01L 24/85; H01L 24/86; H01L 2224/32145; H01L 2224/48221; H01L 2224/48228; H01L 2225/06503; H01L 2225/06506
USPC .......... 257/698, 723, 777, E25.006, E25.021, 257/E25.027, E23.085; 438/109
See application file for complete search history.

(56) References Cited

U.S. PATENT DOCUMENTS 7,291,924 B2 * 11/2007 Wang et al. .................. 257/777
8,115,297 B2    2/2012 Yang
(Continued)

FOREIGN PATENT DOCUMENTS

CN    101179068    5/2008
CN    101872757    10/2010
(Continued)

OTHER PUBLICATIONS

International Search Report and Written Opinion dated Oct. 31, 2013 in International Patent Application No. PCT/CN2013/071051.
(Continued)

*Primary Examiner* — Jasmine Clark
(74) *Attorney, Agent, or Firm* — Vierra Magen Marcus LLP

(57) ABSTRACT

A semiconductor device includes a substrate (102) with a cavity (112) formed therein for receiving a semiconductor die. In examples, the semiconductor die is a controller die (114). The controller die (114) may be electrically connected to the substrate (102) with electrical traces (120) which may be formed for example by printing. After the controller die (114) is electrically connected to the substrate (102), one or more memory die (150) may be affixed to the substrate (102), over the cavity (112) and controller die (114).

22 Claims, 10 Drawing Sheets

(51) Int. Cl.
*H01L 23/00* (2006.01)
*H01L 25/065* (2006.01)
*H01L 25/00* (2006.01)
*H01L 23/13* (2006.01)
*H01L 21/56* (2006.01)
*H01L 23/31* (2006.01)

(52) U.S. Cl.
CPC .......... *H01L 23/3121* (2013.01); *H01L 24/24* (2013.01); *H01L 24/48* (2013.01); *H01L 24/82* (2013.01); *H01L 24/85* (2013.01); *H01L 25/0657* (2013.01); *H01L 25/50* (2013.01); *H01L 23/3128* (2013.01); *H01L 2224/24227* (2013.01); *H01L 2224/24247* (2013.01); *H01L 2224/32145* (2013.01); *H01L 2224/32225* (2013.01); *H01L 2224/32245* (2013.01); *H01L 2224/48101* (2013.01); *H01L 2224/48227* (2013.01); *H01L 2224/48247* (2013.01); *H01L 2224/48471* (2013.01); *H01L 2224/48482* (2013.01); *H01L 2224/49175* (2013.01); *H01L 2224/73265* (2013.01); *H01L 2224/73267* (2013.01); *H01L 2224/82102* (2013.01); *H01L 2224/82105* (2013.01); *H01L 2224/85* (2013.01); *H01L 2225/0651* (2013.01); *H01L 2225/06562* (2013.01); *H01L 2225/06596* (2013.01); *H01L 2924/00014* (2013.01); *H01L 2924/12042* (2013.01); *H01L 2924/15153* (2013.01); *H01L 2924/15311* (2013.01); *H01L 2924/181* (2013.01); *H01L 2924/19105* (2013.01)

(56) References Cited

U.S. PATENT DOCUMENTS

| | | | |
|---|---|---|---|
| 8,125,063 B2 * | 2/2012 | Wang | 257/676 |
| 8,237,257 B2 | 8/2012 | Yang | |
| 2005/0224944 A1 | 10/2005 | Biar et al. | |
| 2008/0217761 A1 * | 9/2008 | Yang et al. | 257/700 |
| 2012/0273959 A1 | 11/2012 | Park et al. | |

FOREIGN PATENT DOCUMENTS

| | | |
|---|---|---|
| CN | 102640283 | 8/2012 |
| CN | 202434509 | 9/2012 |

OTHER PUBLICATIONS

King Dragon International Inc., "Substrate with chips embedded & SIP, MCP, 3D Packaging solution, IP, Technologies Provider, KDI Status updated", Oct. 9, 2012.
Office Action dated Apr. 30, 2015 in Taiwan Patent Application No. 102149303.
Response to Office Action filed Jul. 28, 2015 in Taiwan Patent Application No. 102149303.

* cited by examiner (Step 209)

SEMICONDUCTOR DEVICE INCLUDING EMBEDDED CONTROLLER DIE AND METHOD OF MAKING SAME

BACKGROUND OF THE INVENTION

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

A cross-sectional side view and a top view of a conventional semiconductor package 20 are shown in FIGS. 1 and 2 (without molding compound in FIG. 2). Typical packages include a plurality of semiconductor dies, such as flash memory die 22 and controller die 24, affixed to a substrate 26. A plurality of die bond pads 28 may be formed on the semiconductor dies 22, 24 during the die fabrication process. Similarly, a plurality of contact pads 30 may be formed on the substrate 26. Die 22 may be affixed to the substrate 26, and then die 24 may be mounted on die 22. All dies may then be electrically coupled to the substrate by affixing wire bonds 32 between respective die bond pad 28 and contact pad 30 pairs. Once all electrical connections are made, the dies and wire bonds may be encapsulated in a molding compound 34 to seal the package and protect the dies and wire bonds.

In order to most efficiently use package footprint, it is known to stack semiconductor die on top of each other, either completely overlapping each other, or with an offset as shown in FIGS. 1 and 2. In an offset configuration, a die is stacked on top of another die so that the bond pads of the lower die are left exposed. An offset configuration provides an advantage of convenient access of the bond pads on each of the semiconductor die in the stack. While two memory dies are shown in the stack in FIG. 1, it is known to provide more memory dies in the stack, such as for example four or eight memory dies.

In order to increase memory capacity in semiconductor packages while maintaining or reducing the overall size of the package, the size of the memory die has become large compared to the overall size of the package. As such, it is common for the footprint of the memory die to be almost as large as the footprint of the substrate.

The controller die 24 is generally smaller than the memory die 22. Accordingly, the controller die 24 is conventionally placed at the top of the memory die stack. This configuration has certain drawbacks. For example, it is difficult to form a large number of wire bonds from the die bond pads on the controller die down to the substrate. It is known to provide an interposer or redistribution layer beneath the controller die so that wire bonds are made from the controller die to the interposer, and then from the interposer down to the substrate. Moreover, the relatively long length of the wire bonds from the controller die to the substrate slows down operation of the semiconductor device. It is known to mount the controller die directly on top of the substrate, but this then presents difficulties in mounting the larger memory die on top of the controller die.

DETAILED DESCRIPTION

The present technology will now be described with reference to FIGS. 3 through 19, which in embodiments, relate to a semiconductor device including a controller die mounted within the surface of a substrate. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal" as may be used herein are by way of example and illustrative purposes only, and are not meant to limit the description of the invention inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±.25%.

An embodiment of the present invention will now be explained with reference to the flowchart of FIG. 3 and the perspective and side views of FIGS. 4 through 19. Although FIGS. 4 through 19 each show an individual device 100, or a portion thereof, it is understood that the device 100 may be batch processed along with a plurality of other packages 100 on a substrate panel to achieve economies of scale. The number of rows and columns of packages 100 on the substrate panel may vary.

Figure 4:
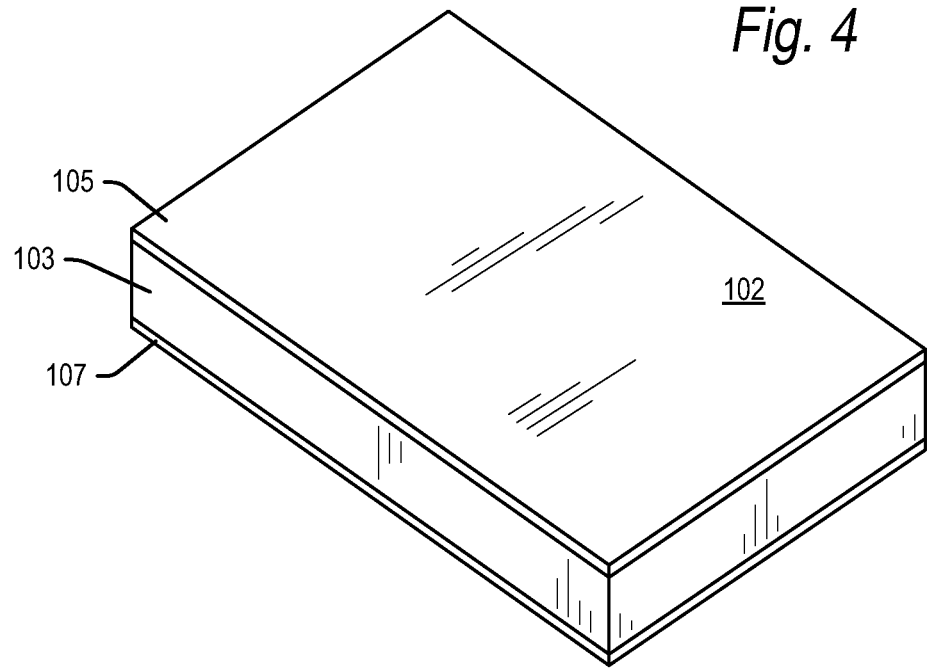
FIG. 4 is a perspective view of a semiconductor device according to the present technology at a step in the fabrication process.

The substrate panel begins with a plurality of substrates 102 (again, one such substrate is shown in FIGS. 4 through 19). The substrate 102 may be a variety of different chip carrier mediums, including a printed circuit board (PCB), a leadframe or a tape automated bonded (TAB) tape. Where substrate 102 is a PCB, the substrate may be formed of a core 103 having a top conductive layer 105 and a bottom conductive layer 107 as seen in FIG. 4. The core 103 may be formed of various dielectric materials such as for example, polyimide laminates, epoxy resins including FR4 and FR5, bismaleimide triazine (BT), and the like. Although not critical to the present invention, the core may have a thickness of between 40 microns (μm) to 200 μm, although the thickness of the core may vary outside of that range in alternative embodiments. The core 103 may be ceramic or organic in alternative embodiments.

The conductive layers 105, 107 surrounding the core may be formed of copper or copper alloys, plated copper or plated copper alloys, Alloy 42 (42Fe/58Ni), copper plated steel, or other metals and materials known for use on substrate panels. The conductive layers may have a thickness of about 12 μm to 18 μm, although the thickness of the layers may vary outside of that range in alternative embodiments.

Figure 1:
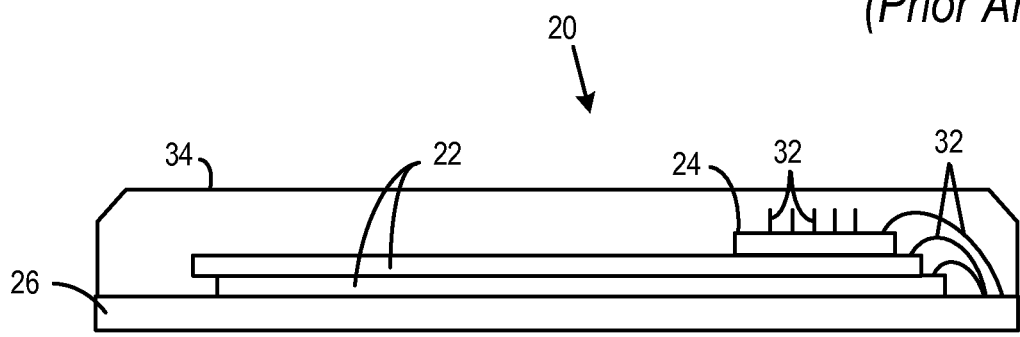
FIG. 1 is a cross-sectional side view of a conventional semiconductor package.
Figure 2:
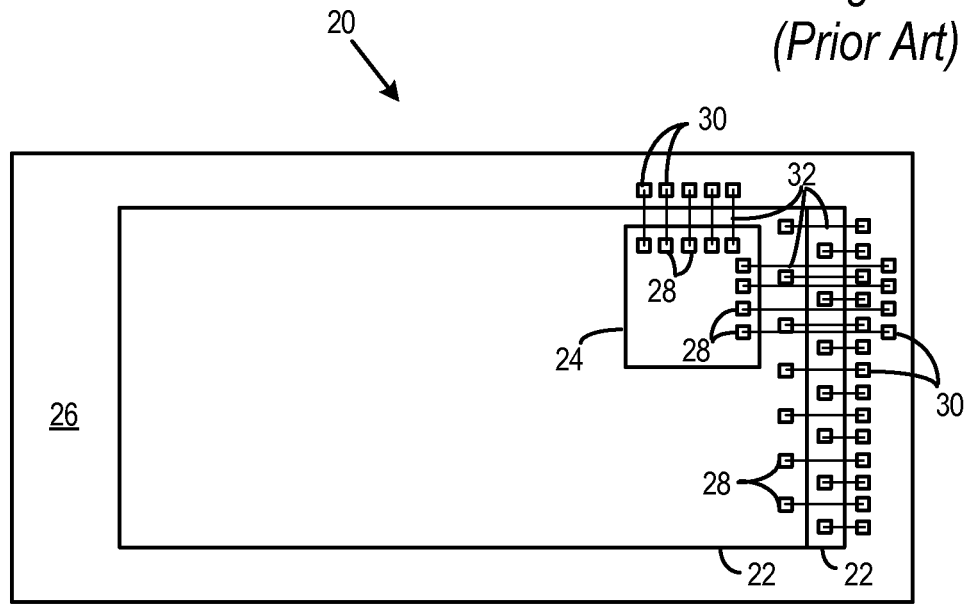
FIG. 2 is a top view of a conventional substrate and wire bonded semiconductor die.
Figure 3:
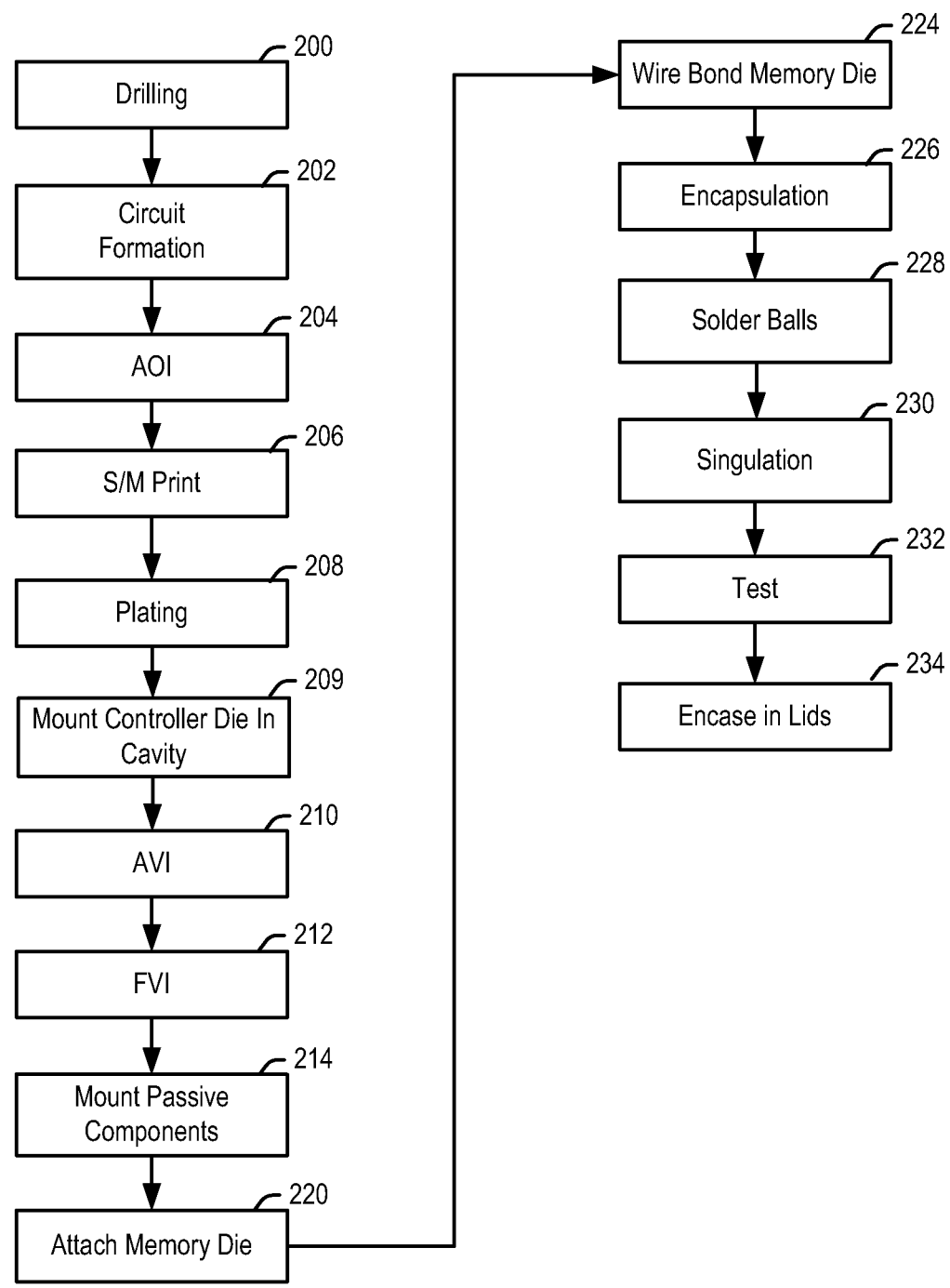
FIG. 3 is a flowchart of the overall fabrication process of semiconductor device according to embodiments of the present invention.

FIG. 3 is a flowchart of the fabrication process for forming a semiconductor device according to embodiments of the present invention. In a step 200, the substrate 102 is drilled to define through-hole vias 104 in the substrate 102. The vias 104 (only some of which are numbered in the figures) shown are by way of example, and the substrate may include many more vias 104 than is shown in the figures, and they may be in different locations than is shown in the figures. Conductance patterns are next formed by selective removing portions of one or both of the top and bottom conductive layers in step 202. The removal of the conductive layer(s) may be performed for example by a known photolithography etching process.

Figure 5:
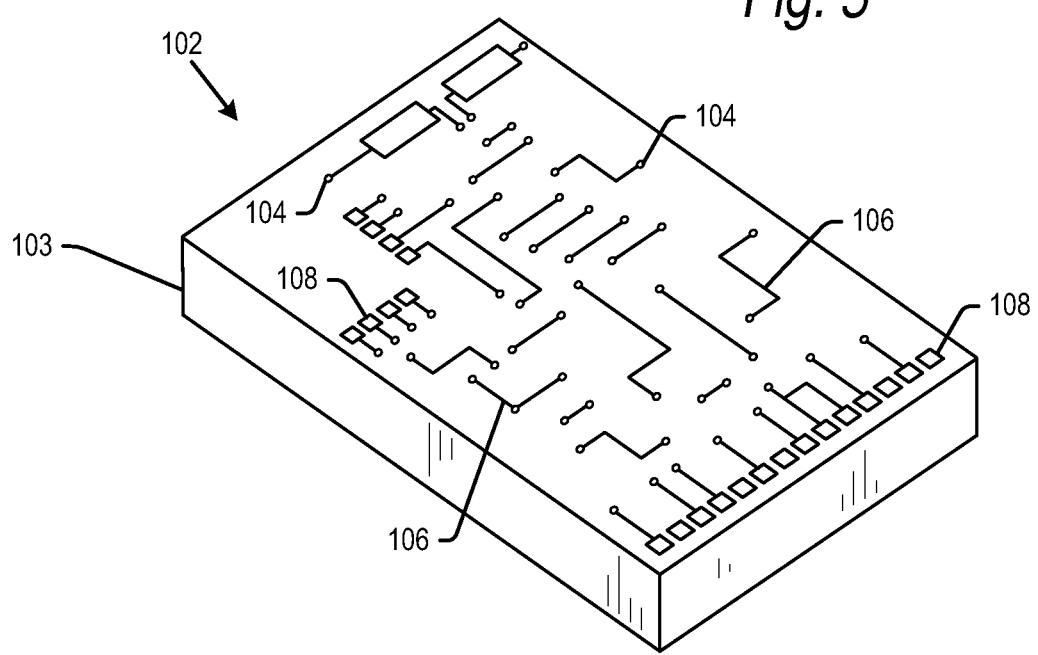
FIG. 5 is a perspective view of a semiconductor device according to the present technology at a further step in the fabrication process.

The portions of the conductive layers left behind form the conductance pattern on the top and/or bottom surfaces of substrate 102 as shown in FIG. 5. The conductance pattern may include electrical traces 106 and contact pads 108. The traces 106 and contact pads 108 (only some of which are numbered in the figures) shown are by way of example, and the substrate 102 may include more traces and/or contact pads than is shown in the figures, and they may be in different locations than is shown in the figures.

Figure 6:
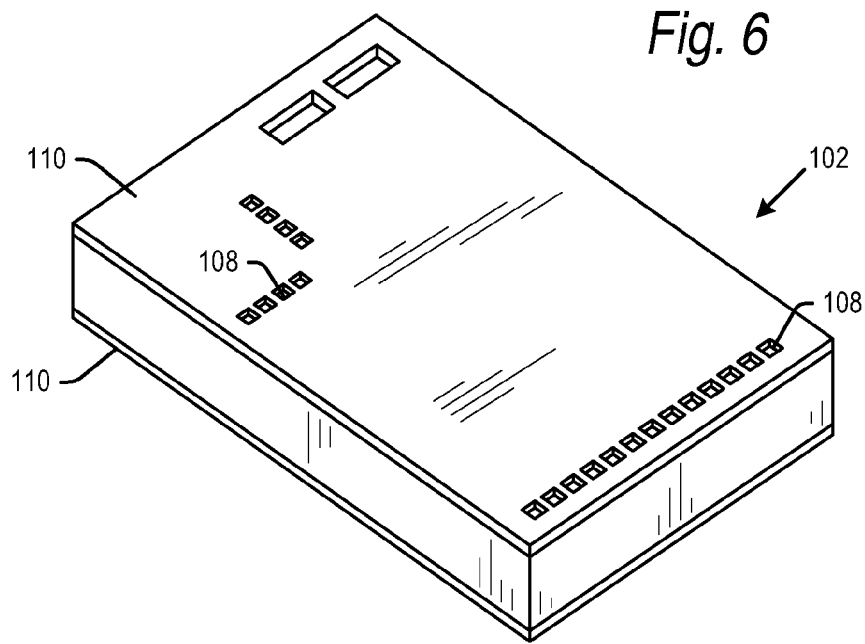
FIG. 6 is a perspective view of a semiconductor device according to the present technology at a further step in the fabrication process.
Figure 7:
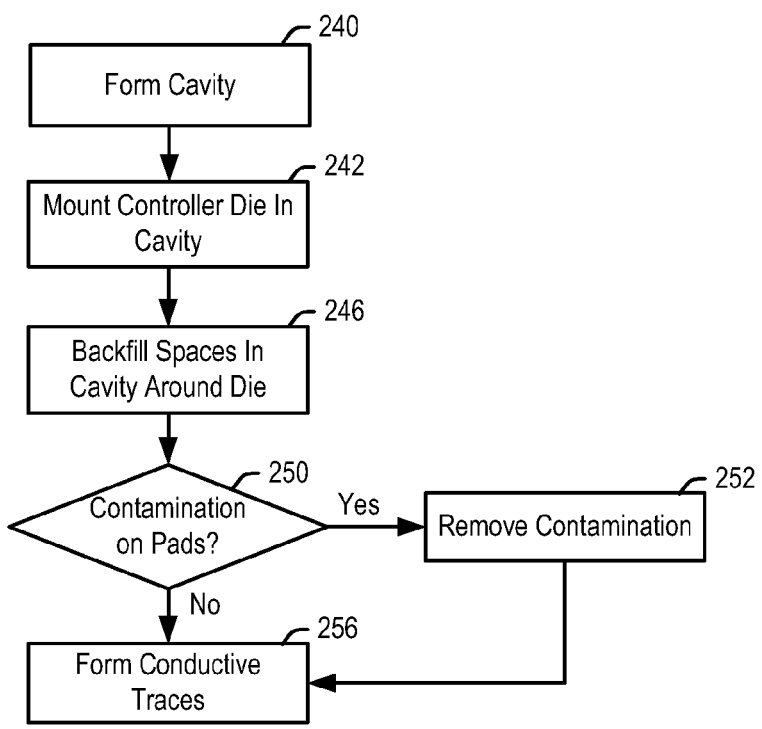
FIG. 7 is a flowchart showing additional detail of step 209 according to embodiments of the present disclosure.
Figure 8:
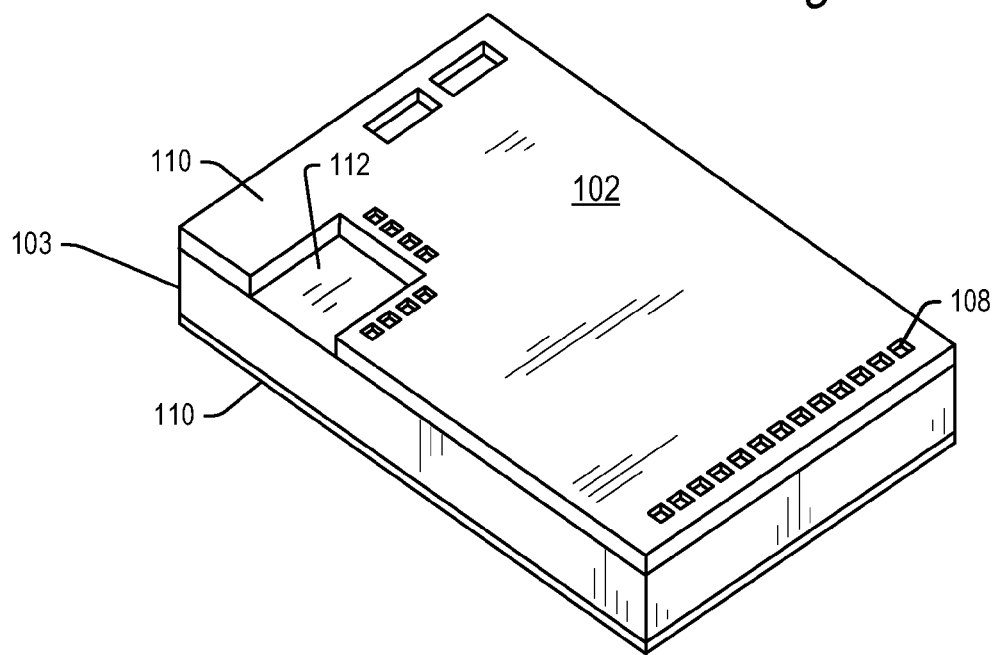
FIG. 8 is a perspective view of a semiconductor device according to the present technology at a further step in the fabrication process.

Referring again to FIG. 3, the substrate 102 may then be inspected in an automatic optical inspection (AOI) in step 204. Once inspected, a solder mask 110 may be applied to the substrate in step 206 and as shown in FIG. 6. As is known, contact pads and contact fingers may be left exposed through openings in the solder mask. After the solder mask is applied, the contact pads, contact fingers and any other solder areas on the conductance patterns may be plated with a Ni/Au, Alloy 42 or the like in step 208 in a known electroplating or thin film deposition process.

In accordance embodiments of the present technology, in step 209, a controller die may be mounted in a cavity formed down into a surface of the substrate 102. Further details of step 209 are explained now with reference to the flowchart of FIG. 7. In step 240, a cavity 112 may be formed in the surface of the substrate 102, as shown for example in FIG. 8. In the example shown in FIG. 8, the cavity 112 is formed down through the upper solder mask layer 110 so that the upper surface of the dielectric layer 103 is exposed at the bottom of the cavity 112. Thus, the cavity 112 may have a depth of the solder mask layer 110 and upper conductive layer 105 combined (as noted above portions of the layer 105 may also been removed to form the conductance pattern). As noted, the depth of the upper conductive layer 105 may be 12 μm to 18 μm, and any solder mask layer 110 may have a thickness of 25 μm±10 μm though it is understood that the upper conductive layer and/or solder mask layer may have thicknesses greater or lesser than that in further embodiments.

In further embodiments explained hereinafter, cavity 112 may alternatively be formed through the upper solder mask layer and down into the dielectric layer 103. Further still, it is contemplated that substrate 102 and be formed of several dielectric layers 103 interspersed between conductive copper layers, all sandwiched between solder mask layers on the upper and lower surfaces. In such embodiments, the cavity 112 may be formed through the upper solder mask layer and then down through one or more conductive and/or dielectric layers. In embodiments described herein, cavity 112 is formed on an upper surface of the substrate 102 (a surface of the substrate 102 receiving the memory die as described hereinafter). However, in an alternative embodiment, cavity 112 may be formed in a lower surface of the substrate 102, and a controller die may be mounted in the cavity 112 on the lower surface.

In embodiments, cavity 112 has the same footprint or slightly larger footprint than the controller die to be seated therein. The depth of cavity 112 may be the same as or larger than the thickness of the controller die. The cavity 112 may be formed by variety of methods, including for example etching, use of a laser, or combinations of these methods.

Figure 9:
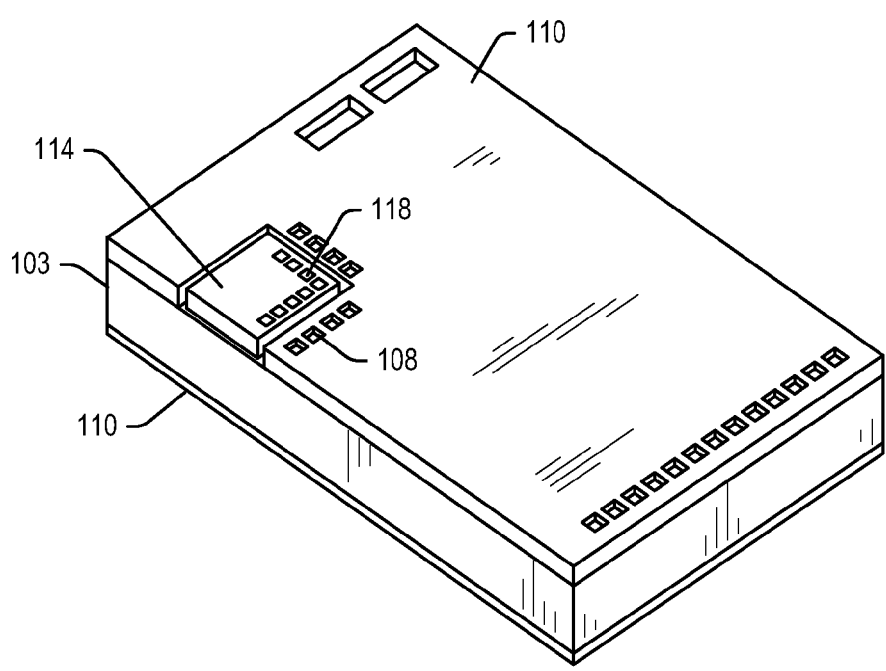
FIG. 9 is a perspective view of a semiconductor device according to the present technology at a further step in the fabrication process.
Figure 10:
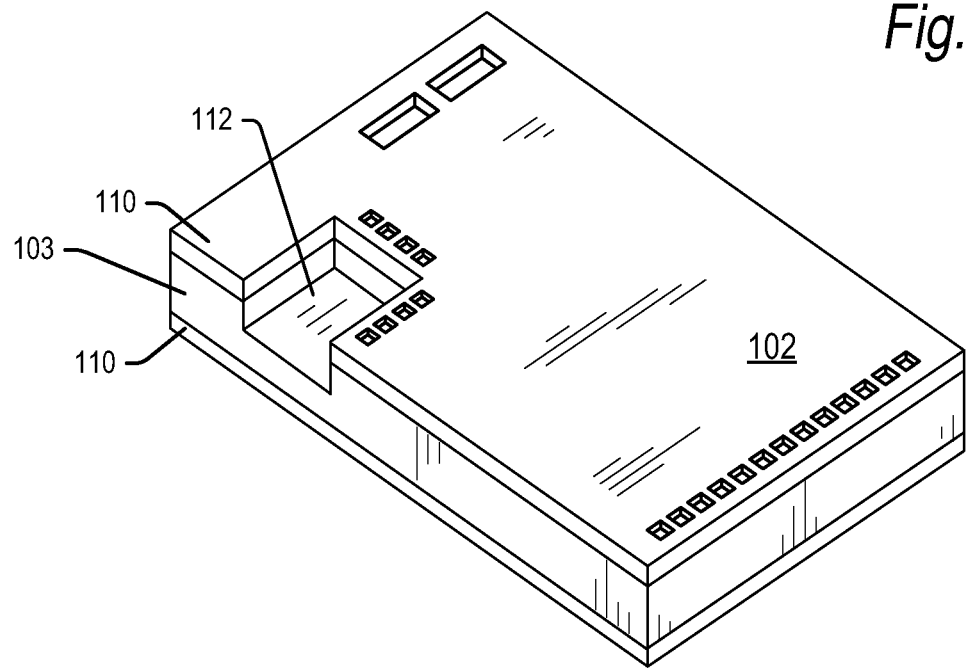
FIG. 10 is a perspective view of a semiconductor device according to an alternative embodiment of the present technology
Figure 11:
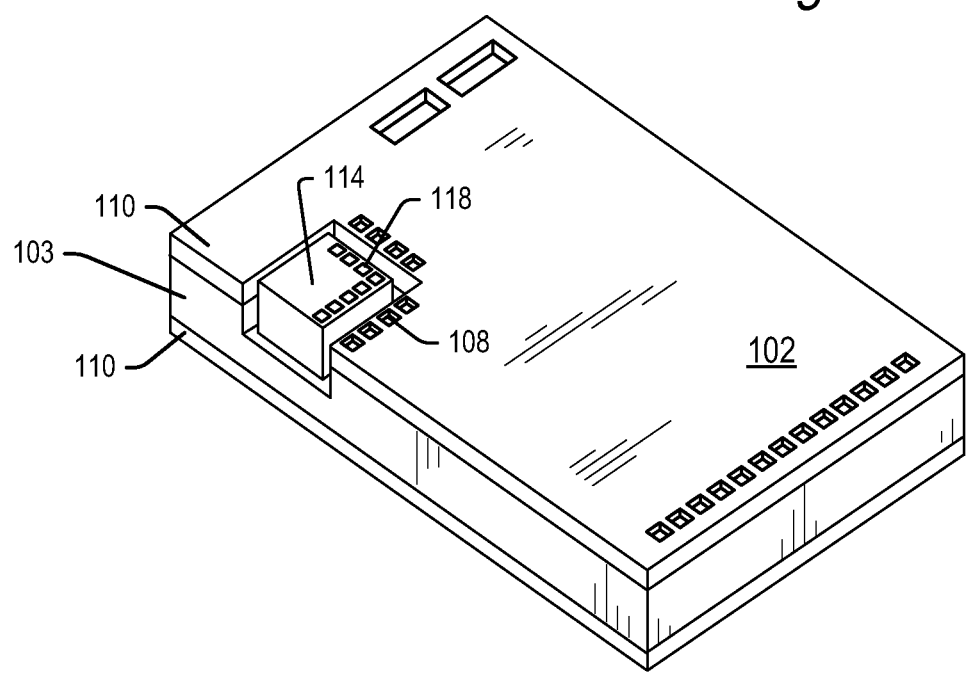
FIG. 11 is a perspective view of a semiconductor device according to the alternative embodiment of FIG. 10 at a further step in the fabrication process.

In step 242, a controller die 114 may be mounted within the cavity 112 as shown in FIG. 9. The controller die 114 may for example be an ASIC, though other semiconductor dies such as DRAM are contemplated. As noted above, cavity 112 may be deeper than simply the solder mask layer 110. For example, as shown in FIGS. 10 and 11, the cavity 112 is formed through the solder mask layer 110 and partially into the dielectric layer 103. Such embodiments may be useful for thicker die 114, such as shown in FIG. 11, so that the upper surface of die 114 is at or below the upper surface of solder mask layer 110. While the upper surface of die 114 within cavity 112 is at or below the upper surface of solder mask layer 110 in embodiments of the present technology, it is understood that the upper surface of die 114 within cavity 112 may be above the upper surface of solder mask 110 in further embodiments.

In step 246, to the extent that space may exist around the edges of the controller die 114 in cavity 112, those spaces may be filled with a dielectric material 116. The dielectric material may for example be a B-stage adhesive, examples of which include EM-710H-P from Nitto-Denko Corp. having a headquarters in Japan, and 6202C epoxy from Henkel AG & Co. KGaA. In these examples, the dielectric material 116 electrically insulates controller die 114, and also secures the die 114 to the substrate 102. In further embodiments, a separate die attach adhesive may be used to mount the controller die 114 in cavity 112, and thereafter, any spaces around the edges of the controller die 114 may be filled with dielectric material 116. In this latter example, the dielectric material 116 need not be an adhesive. In still further embodiments, the dielectric material 116 may be placed within the cavity 112 before die 114 so that the dielectric material 116 surrounds the bottom surface and sides of die 114.

The controller die 114 includes die bond pads 118, one of which is labeled for example in FIG. 9. In step 250, a visual and/or automated inspection may be done on die bond pads 118 to determine whether any of the dielectric material 116 or other contaminant has deposited on the die bond pads 118 which may interfere with electrical connection of the controller die 114 to the substrate 102 as explained below. If such contamination is found, the contamination may be removed in step 252. As one example, a laser may be used to burn off or vaporize any contamination on the die bond pads 118.

After removal of the contamination, or after backfill with dielectric material 116 if no contamination is found, conductive traces 120 may be formed between die bond pads 118 on controller die 114 and contact pads 108 on the substrate 102. One conductive trace 120 is labeled in FIG. 12.

Figure 12:
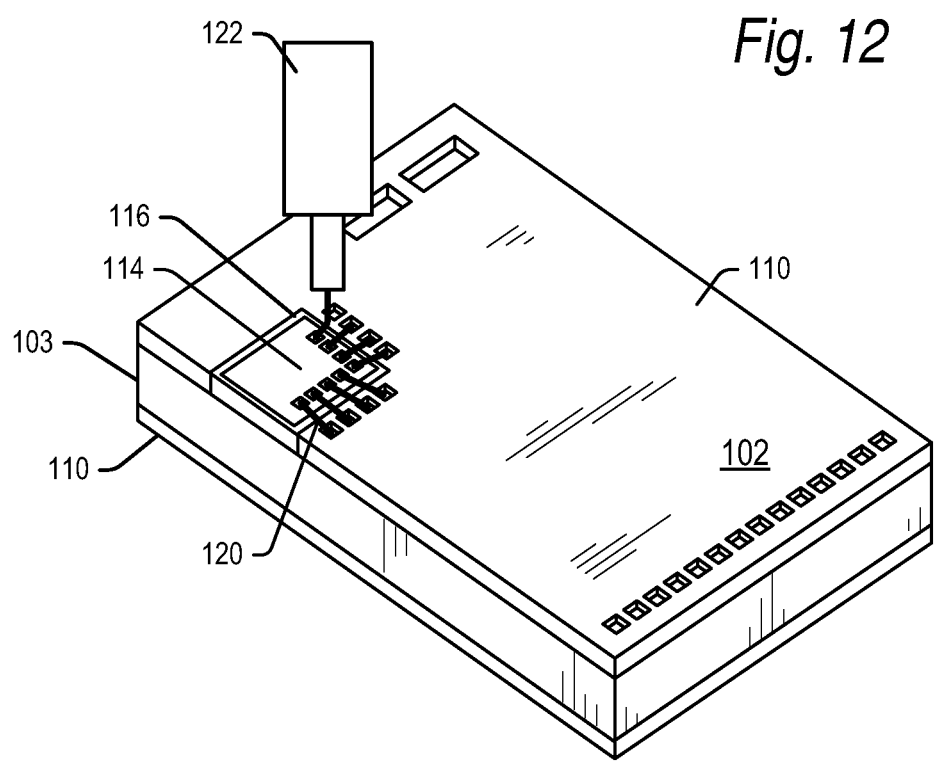
FIG. 12 is a perspective view of a semiconductor device according to the embodiment of FIG. 9 at a further step in the fabrication process.

The conductive traces 120 may be formed by variety of methods. In one embodiment, the traces may be printed on the space on the substrate and controller die between contact pad 108 and die bond pad 118 to electrically connect respective pads 108 to pads 118. For example, as shown in FIG. 12, one or more print heads 122 may be provided as part of an aerosol (or other) printing process to print the electrically conductive traces 120 between pads 108 and 118. Such a printing process is known, for example from Sirris, having a place of business in Liege, Belgium. The traces 120 may for example be an electrical conductor including copper, silver, gold, palladium, combinations thereof and/or other electrical conductors. The traces 120 may alternatively be a conductive polymer PEDOT:PSS (poly(3,4-ethylenedioxythiophene) poly(styrenesulfonate)), or CNT (carbon nanotube) material.

The print head 122 may deposit electrical traces 120 by a variety of technologies, including for example continuous and/or drop on demand (DOD) printing. A variety of other technologies may be used to deposit traces 120 by print head 122 or otherwise, including for example, plating, screen printing and thin film deposition. Electrical traces 120 printed according to the above-described technologies may be printed with a fine pitch, such as for example 10 μm line width, and 20 μm spacing between traces 120. Other line widths and spacings are contemplated in further embodiments.

Figure 13:
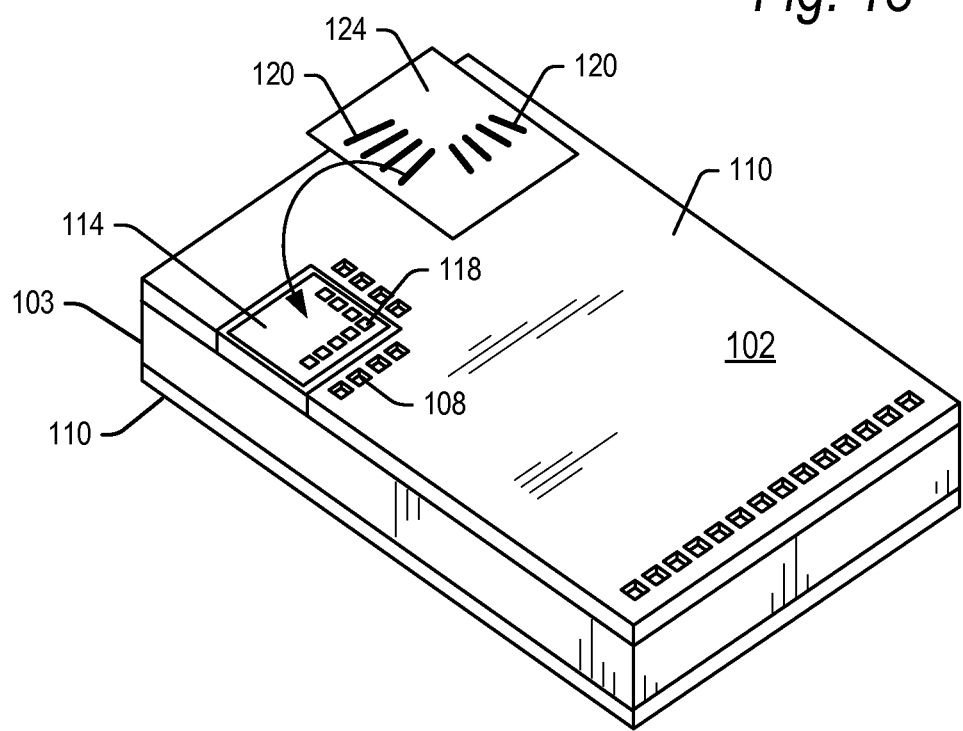
FIGS. 13 and 14 are perspective views of a semiconductor device according to an alternative embodiment to that shown in FIG. 11.
Figure 14:
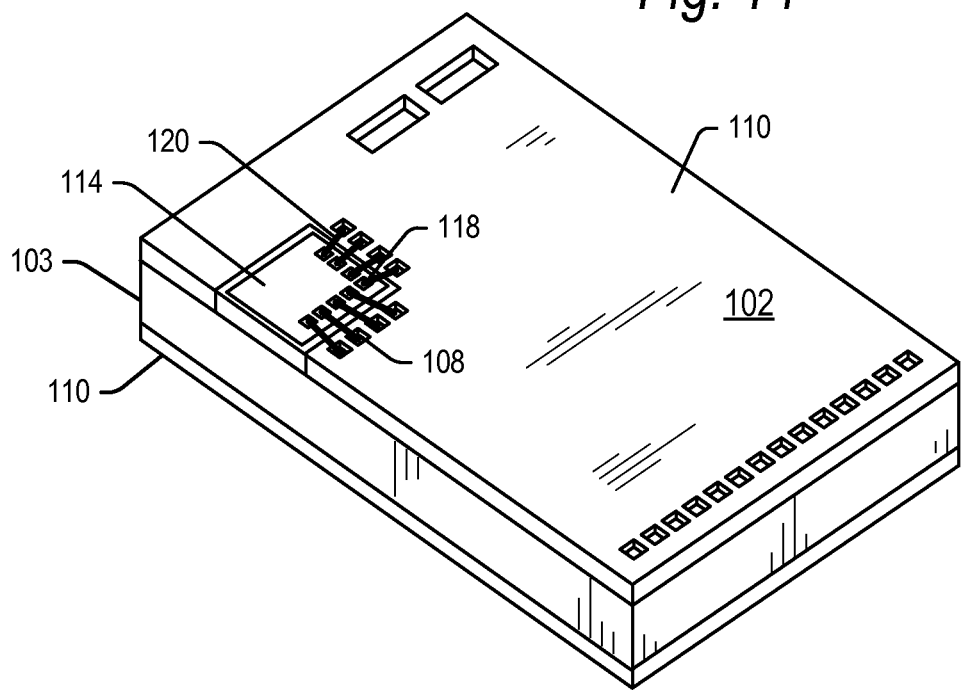

Electrical traces 120 is formed by variety of other technologies in further embodiments. For example, as shown in FIGS. 13 and 14, the traces 120 may be pre-printed on a flexible film 124. The film 124 may for example be printed circuit tape from WUS Printed Circuit Co. Ltd., having a place of business in Kaohsiung, Taiwan, R. O. C. Such films may include conductive traces 120 printed, deposited or otherwise formed on the film 124. The film may include an ETFE (ethylene tetrafluoroethylene) backing layer, an adhesive layer, and a release agent between the backing layer and the adhesive layer. The pattern of electrical traces may be provided in or on the adhesive layer.

The release agent may be a solid at room temperature with adhesive properties so as to adhere with the backing layer. The film 124 may be positioned on the substrate and controller die (flipped from the position shown in FIG. 13) so that the electrical traces 120 are properly positioned so as to extend between respective contact and bond pads 108, 118. The film 124 may be heated under pressure, at which point the release agent melts, separating the adhesive layer and conductive traces 120 from the backing layer. The adhesive layer may be cured to adhere the electrical traces in place on the substrate 102 and controller die 114 as shown in FIG. 14. Further details of the composition and application of film 124 are disclosed in applicants co-pending International Patent Application No. PCT/CN2011/084137, which application is incorporated by reference herein in its entirety.

Figure 15:
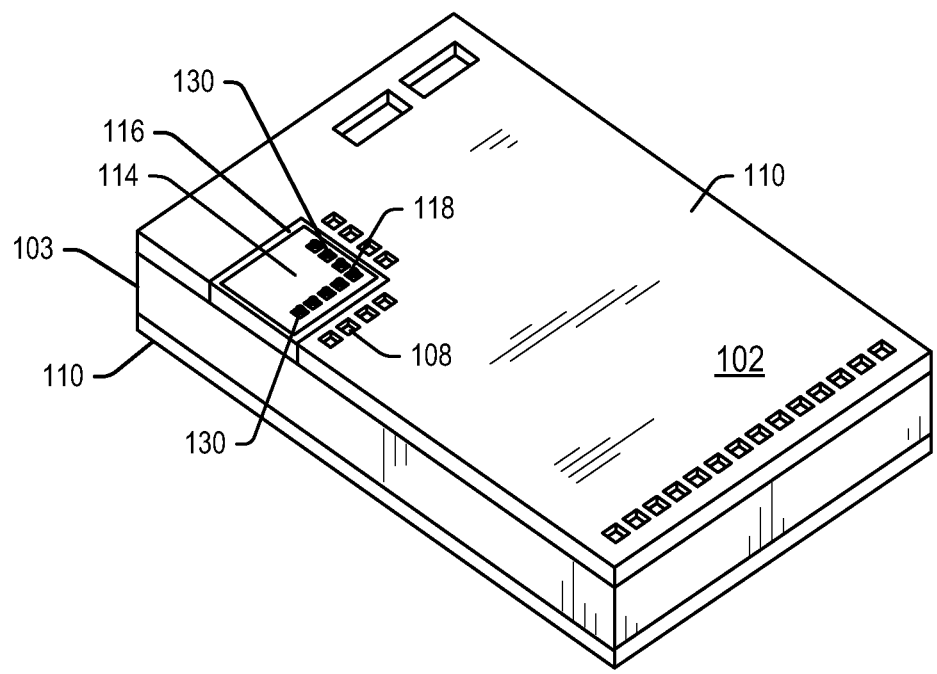
FIGS. 15 and 16 are perspective views of a semiconductor device according to a further alternative embodiment to that shown in FIG. 11.
Figure 16:
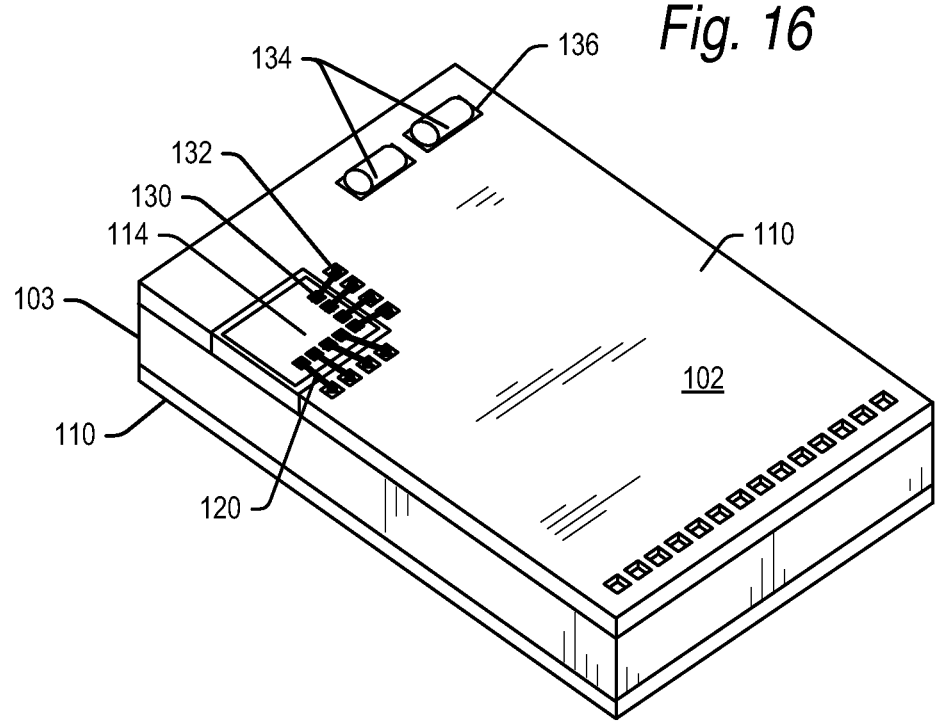

A further method for forming electrical traces 120 with "no loop" wire bonds between pads 108 and 118 is shown in FIGS. 15 and 16. In this embodiment, ball bonds 130 (two of which are labeled in FIG. 15) may be deposited on die bond pads 118 of controller die 114 using a wire bonding capillary (not shown). The capillary may then form a reverse wire bond by depositing a ball 132 (FIG. 16) on contact pad 108, and extending the wire bond stitch from the ball 132 to the ball bond 130. The wire bond may be referred to as "no loop," because the wire may be pulled taut between the ball 132 and the ball bond 130. It is understood that the respective positions of the ball bonds 130 and balls 132 may be switched in further embodiments. It is also understood that further low height wire bonding methods may be used to electrically couple contact pads 108 with die bond pads 118 in further embodiments.

Returning now to the flowchart of FIG. 3, after the controller die 114 is mounted and cavity 112 in step 209, the substrate 102 may be inspected and tested in an automated inspection process (step 210) and in a final visual inspection (step 212) to check electrical operation, and for contamination, scratches and discoloration. It is understood that automated inspections and/or visual inspections may also be performed as part of mounting the controller die 114 in cavity 112 in step 209.

Passive components 134 may next be affixed to the substrate in a step 214, for example within openings 136 in the solder mask 110 layer (FIG. 16). The one or more passive components 134 may include for example one or more capacitors, resistors and/or inductors, though other components are contemplated. The passive components 134 shown are by way of example only, and the number, type and position may vary in further embodiments.

Figure 17:
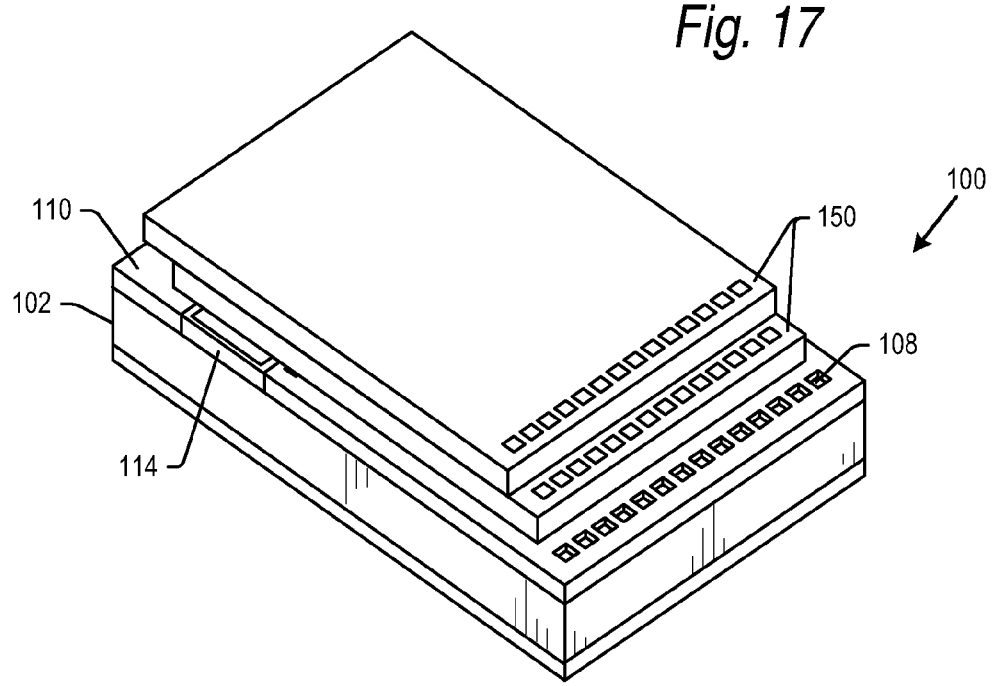
FIG. 17 is a perspective view of a semiconductor device according to the any of the embodiments of FIGS. 12-16 at a further step in the fabrication process.
Figure 18:
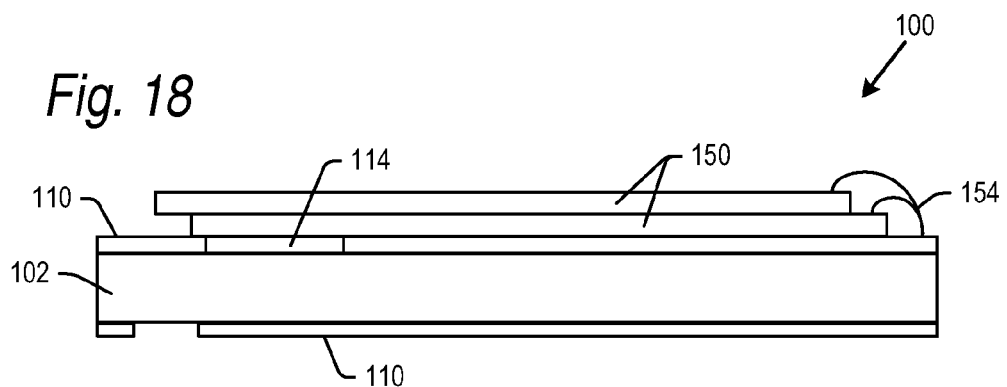
FIG. 18 is a perspective view of a semiconductor device according to FIG. 17 at a further step in the fabrication process.
Figure 19:
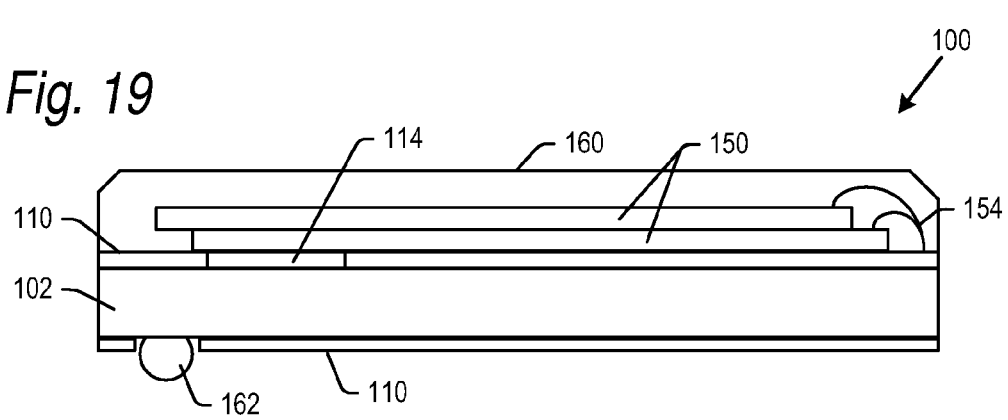
FIG. 19 is a perspective view of a semiconductor device according to FIG. 18 at a further step in the fabrication process.

Next, in step 220, one or more memory die 150 may be mounted to the substrate 102, as shown in FIG. 17-19. The memory die 150 may for example be NAND flash memory die, but other types of die 150 may be mounted to the substrate in step 220 in further embodiments. FIGS. 17-19 show an embodiment where two dies 150 are mounted, but there may be more or less memory die 150 in further embodiments. In accordance with aspects of the present technology, the memory die 150 may lie flat against an upper surface of solder mask layer 110, above the memory die 114.

In embodiments, each die 150 may be wire bonded to the substrate 102 using wire bonds 152 in step 224 after it is positioned on the substrate 102, as shown in the side view of FIG. 18. In further embodiments, all dies may be positioned on the substrate, and then after that, all dies may be wire bonded to the substrate.

Following mounting of the die stack and wire bonding, the die stack, wire bonds and at least a portion of the substrate may be encapsulated in a mold compound 160 in a step 226 and as shown in FIG. 19. Mold compound 160 may include for example solid epoxy resin, Phenol resin, fused silica, crystalline silica, carbon black and/or metal hydroxide. Such mold compounds are available for example from Sumitomo Corp. and Nitto-Denko Corp., both having headquarters in Japan. Other mold compounds from other manufacturers are contemplated. The mold compound may be applied according to various known processes, including by transfer molding or injection molding techniques. The encapsulation process may be performed by FFT (Flow Free Thin) compression molding in further embodiments. Such an FFT compression molding process is known and described for example in a publication by Matsutani, H. of Towa Corporation, Kyoto, Japan, entitled "Compression Molding Solutions For Various High End Package And Cost Savings For Standard Package Applications," Microelectronics and Packaging Conference, 2009, which publication is incorporated by reference herein in its entirety.

In embodiments, the finished semiconductor device 100 may be used as a ball grid array (BGA) package which gets permanently soldered to a printed circuit board of a host device. For such embodiments, solder balls 162 may be soldered to a lower surface of the substrate 102 in step as shown in FIG. 19. In further embodiments, the finished semiconductor device 100 may be a land grid array (LGA) package including contact fingers for removably coupling the finished device 100 within a host device. In such embodiments, step 226 may be skipped, and the lower surface may include contact fingers instead of the contact pads that receive solder balls.

The respective packages may be singulated in step 230 from the panel to form the finished semiconductor device 100 shown in FIG. 18. Each semiconductor device 100 may be singulated by any of a variety of cutting methods including sawing, water jet cutting, laser cutting, water guided laser cutting, dry media cutting, and diamond coating wire cutting. While straight line cuts will define generally rectangular or square shaped semiconductor device 100, it is understood that semiconductor device 100 may have shapes other than rectangular and square in further embodiments of the present invention.

Once cut into packages 100, the packages may be tested in a step 232 to determine whether the packages are functioning properly. As is known in the art, such testing may include electrical testing, burn in and other tests. Optionally, in step 234, the finished semiconductor devices may be encased within a lid (not shown), for example where the semiconductor devices are LGA packages.

The finished semiconductor package 100 may for example be a memory card such as for example an MMC card, an SD card, a multiuse card, a micro-SD card, a memory stick, a compact SD card, an ID card, a PCMCIA card, an SSD card, a chip-card, a smartcard, an USB card, an MCP-type embedded card storage, or the like.

In summary, in one example, the present technology relates to a semiconductor device, comprising: a substrate including a dielectric layer and a conductive layer on the dielectric layer, the conductive layer including a conductance pattern including electrical traces and contact pads; a solder mask layer formed over the conductive layer; a cavity formed in the substrate, down to the dielectric layer at a bottom of the cavity; a first semiconductor die mounted in the cavity, electrically isolated on the dielectric layer, the first semiconductor die including die bond pads; electrical traces formed between the contact pads of the substrate and the die bond pads of the first semiconductor die to electrically connect the first semiconductor die to the substrate; and a second semiconductor die mounted on the substrate, covering at least a portion of the cavity including the first semiconductor die.

In another example, the present technology relates to a semiconductor device, comprising: a substrate including contact pads; a cavity formed in the substrate; a first semiconductor die mounted in the cavity, the first semiconductor die including die bond pads; printed electrical traces formed between the contact pads of the substrate and the die bond pads of the first semiconductor die to electrically connect the first semiconductor die to the substrate; and a second semiconductor die mounted on the substrate, covering at least a portion of the cavity including the first semiconductor die.

In another example, the present technology relates to a semiconductor device, comprising: a substrate including contact pads; a cavity formed in the substrate; a first semiconductor die mounted in the cavity, the first semiconductor die including die bond pads; electrical traces and an adhesive from a flexible film, the electrical traces applied between the contact pads of the substrate and the die bond pads of the first semiconductor die to electrically connect the first semiconductor die to the substrate; and a second semiconductor die mounted on the substrate, covering at least a portion of the cavity including the first semiconductor die.

In a still further example, the present technology relates to a method of making a semiconductor device, comprising: (a) forming a substrate including a dielectric layer and a conductive layer on the dielectric layer, the conductive layer including a conductance pattern including electrical traces and contact pads; (b) forming a solder mask layer over the conductive layer; (c) forming a cavity in the substrate, down to the dielectric layer at a bottom of the cavity; (d) mounting a first semiconductor die in the cavity, electrically isolated on the dielectric layer, the first semiconductor die including die bond pads; (e) printing electrical traces between the contact pads of the substrate and the die bond pads of the first semiconductor die to electrically connect the first semiconductor die to the substrate; and (f) mounting a second semiconductor die on the substrate, covering at least a portion of the cavity including the first semiconductor die.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
   a substrate including a dielectric layer and a conductive layer on the dielectric layer, the conductive layer including a conductance pattern including electrical traces and contact pads;
   a solder mask layer formed on the substrate over the conductive layer;
   a cavity formed in the substrate, down through the solder mask layer to a surface of the substrate on which the solder mask layer is formed;
   a first semiconductor die mounted in the cavity, electrically isolated on the dielectric layer, the first semiconductor die including die bond pads;
   the electrical traces formed between the contact pads of the substrate and the die bond pads of the first semiconductor die to electrically connect the first semiconductor die to the substrate; and
   a second semiconductor die mounted on the substrate, covering at least a portion of the cavity including the first semiconductor die.

2. The semiconductor device of claim 1, further comprising a dielectric material filling a space in the cavity around edges of the first semiconductor die.

3. The semiconductor device of claim 1, wherein the first semiconductor die is a controller die.

4. The semiconductor device of claim 1, wherein the second semiconductor die is a memory die.

5. The semiconductor device of claim 1, wherein a depth of the cavity is substantially equal to a thickness of the first semiconductor die.

6. The semiconductor device of claim 1, wherein a depth of the cavity is greater than a thickness of the first semiconductor die.

7. A semiconductor device, comprising:
   a substrate including contact pads;
   a solder mask layer formed on a surface of the substrate;
   a cavity defined by an opening in the solder mask;
   a first semiconductor die mounted in the cavity, the first semiconductor die including die bond pads;
   printed electrical traces formed between the contact pads of the substrate and the die bond pads of the first semiconductor die to electrically connect the first semiconductor die to the substrate; and
   a second semiconductor die mounted on the substrate, covering at least a portion of the cavity including the first semiconductor die.

8. The semiconductor device of claim 7, further comprising a dielectric material filling a space in the cavity around edges of the first semiconductor die.

9. The semiconductor device of claim 7, wherein the opening in the solder mask is substantially the same shape as a footprint of the first semiconductor die.

10. The semiconductor device of claim 7, wherein a depth of the cavity is substantially equal to a thickness of the first semiconductor die.

11. The semiconductor device of claim 7, wherein a depth of the cavity is greater than a thickness of the first semiconductor die.

12. A semiconductor device, comprising:
    a substrate including contact pads;
    a cavity formed in the substrate;
    a first semiconductor die mounted in the cavity, the first semiconductor die including die bond pads;
    electrical traces and an adhesive, the electrical traces and adhesive applied to the semiconductor device from a flexible film, the electrical traces applied between the contact pads of the substrate and the die bond pads of the first semiconductor die to electrically connect the first semiconductor die to the substrate; and
    a second semiconductor die mounted on the substrate, covering at least a portion of the cavity including the first semiconductor die.

13. The semiconductor device of claim 12, further comprising a dielectric material filling a space in the cavity around edges of the first semiconductor die.

14. The semiconductor device of claim 12, the substrate further comprising a solder mask layer, wherein the cavity is defined by an opening in the solder mask.

15. The semiconductor device of claim 12, the substrate further comprising a layer of conductive material on a dielectric layer, wherein the cavity is defined by an absence of the electrically conductive material in an area.

16. The semiconductor device of claim 12, wherein a depth of the cavity is substantially equal to a thickness of the first semiconductor die.

17. The semiconductor device of claim 12, wherein a depth of the cavity is greater than a thickness of the first semiconductor die.

18. The semiconductor device of claim 12, wherein the first semiconductor die is a controller die.

19. The semiconductor device of claim 18, wherein the second semiconductor die is a memory die.

20. A method of making a semiconductor device, comprising:
    (a) forming a substrate including a dielectric layer and a conductive layer on the dielectric layer, the conductive layer including a conductance pattern including electrical traces and contact pads;
    (b) forming a solder mask layer over the conductive layer;
    (c) forming a cavity in the substrate, down to the dielectric layer at a bottom of the cavity;
    (d) mounting a first semiconductor die in the cavity, electrically isolated on the dielectric layer, the first semiconductor die including die bond pads;
    (e) printing electrical traces between the contact pads of the substrate and the die bond pads of the first semiconductor die to electrically connect the first semiconductor die to the substrate; and
    (f) mounting a second semiconductor die on the substrate, covering at least a portion of the cavity including the first semiconductor die.

21. The method of claim 20, further comprising a step (g) of filling a space between edges of the first semiconductor die and cavity with a dielectric material.

22. The method of claim 21, further comprising a step (h) of removing the dielectric material or contamination from the die bond pads after said step (g) with a laser.

* * * * *